United States Patent
Bishop

[11] Patent Number: 5,831,371
[45] Date of Patent: Nov. 3, 1998

[54] SNAP-ACTION FERROELECTRIC TRANSDUCER

[75] Inventor: Richard P Bishop, Fairfax Station, Va.

[73] Assignee: Face International Corp., Norfolk, Va.

[21] Appl. No.: 840,031

[22] Filed: Apr. 24, 1997

Related U.S. Application Data

[60] Provisional application No. 60/031,640, Nov. 22, 1996.

[51] Int. Cl.⁶ .................................................. H01L 41/08
[52] U.S. Cl. ........................................ 310/328; 310/330
[58] Field of Search ..................................... 310/328, 330

[56] References Cited

U.S. PATENT DOCUMENTS

| | | | |
|---|---|---|---|
| 3,510,698 | 5/1970 | Massa | 310/328 |
| 3,940,637 | 2/1976 | Ohigashi et al. | 310/338 |
| 4,383,195 | 5/1983 | Kolm et al. | 310/330 |
| 4,580,074 | 4/1986 | Gilman | 310/339 |
| 5,216,316 | 6/1993 | Ipcinski | 310/338 |
| 5,286,199 | 2/1994 | Kipke | 434/114 |
| 5,315,204 | 5/1994 | Park | 310/339 |
| 5,589,725 | 12/1996 | Haertling | 310/330 |
| 5,600,197 | 2/1997 | Takeuchi et al. | 310/328 |
| 5,628,411 | 5/1997 | Mills et al. | 209/644 |
| 5,702,618 | 12/1997 | Saaski et al. | 216/2 |

*Primary Examiner*—Thomas M. Dougherty
*Attorney, Agent, or Firm*—Stephen E. Clark

[57] ABSTRACT

A piezoelectric snap-actuator includes a piezoelectric bender element with electrodes disposed on each major face, a spring member for causing the device to snap from a first neutral position to a second neutral position, a prestress layer for applying a compressive force to the piezoelectric bender element, and adhesive layers is provided. The piezoelectric bender element and the spring member are each bonded to the opposite faces of the prestress layer by an adhesive layer. The device assumes one of two neutral positions when not electrically energized. Due to the direction of poling of the piezoelectric bender element, when the piezoelectric bender element is electrically energized it strains in a longitudinal direction. This strain causes the device to deform. When the electrical energy is turned off, the device returns to one of the two neutral positions.

6 Claims, 2 Drawing Sheets

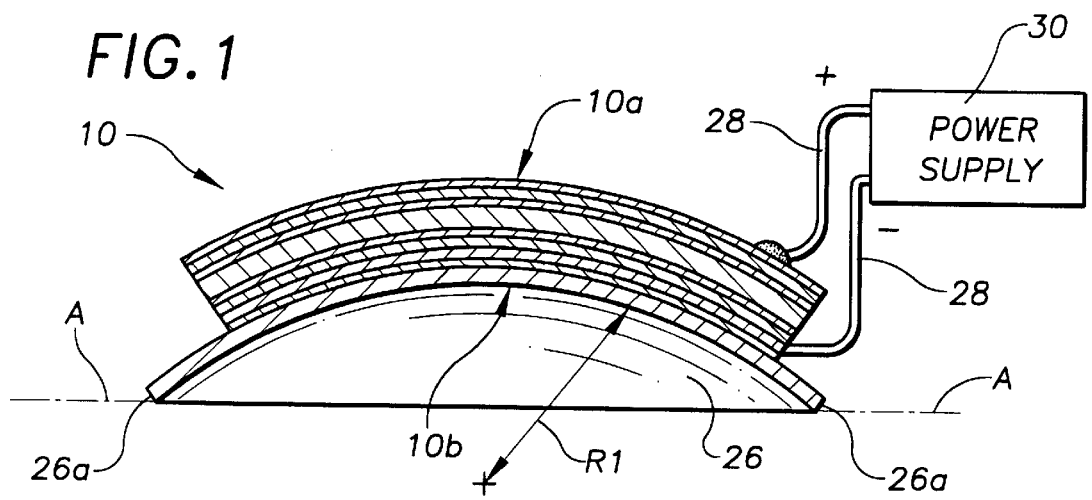
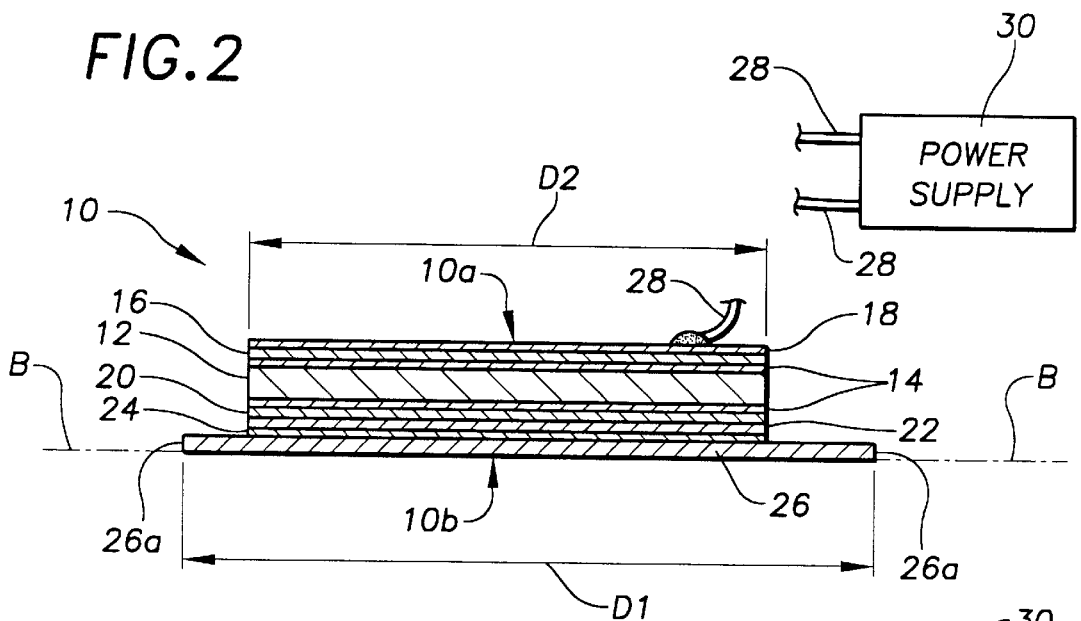
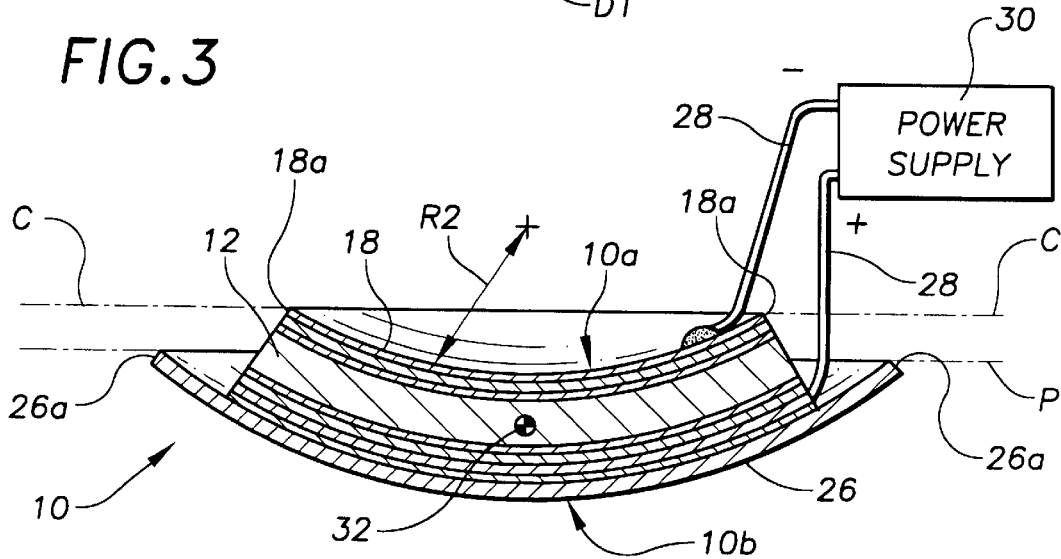

SNAP-ACTION FERROELECTRIC TRANSDUCER

This application is a provisional application Ser. No. 60/031,640 filed Nov. 22, 1996.

BACKGROUND OF THE INVENTION

1. Field of Invention

The present invention relates generally to electrically active ceramic devices and, more particularly, to asymmetrically stress biased piezoelectric or electrostrictive devices having an integral electrode.

2. Description of the Prior Art

Piezoelectric and electrostrictive materials develop a polarized electric field when placed under stress or strain. Conversely, they undergo dimensional changes in an applied electric field. The dimensional change (i.e. expansion or contraction) of a piezoelectric or electrostrictive material is a function of the applied electric field. Piezoelectric and electrostrictive materials can possess a large number of combined and useful properties such as piezoelectric (electric field dependent strain), electrostrictive, dielectric, pyroelectric (temperature dependent polarization), ferroelectric (electric field dependent polarization) and electrooptic (electric field dependent optical birefringence).

Recently, electrostrictive devices have generated considerable interest because of their increased strain under sizable loads as well as their not requiring high voltages. In addition, modification of piezoelectric devices' geometries in order to increase achievable strain are also of interest. These devices have a wide range of application which include actuators, switches, pumps, speakers, sensors, switches, hydrophones, hydrospeakers, adaptive optics, variable focus mirrors and lenses, vibrators, benders, accelerometers, strain gauges and saddle inchworms.

Various forms of electroactive devices are known in the prior art. The simplest of such prior devices are the direct mode actuators, which make direct use of a change in the dimensions of the material when activated by an electric field, without amplification of the actual displacement. The direct mode actuator includes a piezoelectric or electrostrictive ceramic plate sandwiched between a pair of electrodes formed on its major surfaces. The device is generally formed of a material which has a sufficiently large piezoelectric and/or electrostrictive coefficient to produce the desired strain in the ceramic plate. By applying a voltage of appropriate amplitude and polarity between some dimensions of the device, it will cause the piezoelectric (or electrostrictive) material to contract or expand in that direction. When the device expands or contracts in one dimension (the thickness or longitudinal direction) it generally contracts or expands respectively, in dimensions in a plane perpendicular thereto (planar or transverse direction).

Direct mode actuators utilize either the longitudinal extensional mode or lateral extensional mode and are capable of sustaining high loads under compression (in excess of 1000 pounds on a ¾ inch rod under an applied electric field of 25 V/mil). However direct mode actuators suffer from the disadvantage of a very small displacement (strain) that they are able to achieve which is at best a few tenths of a percent.

Indirect mode actuators achieve strain amplification via external structures. An example of an indirect mode actuator is a flextensional transducer. Flextensional transducers are composite structures composed of a piezoelectric ceramic element and a metallic shell, stressed plastic or fiberglass structure. The actuator movement of conventional flextensional devices commonly occurs as a result of expansion in the piezoelectric material which mechanically couples to an amplified contraction of the device in the transverse direction. In operation, they can exhibit up to about 0.5% strain at +/−25V/mil applied electric field and can sustain loads up to several hundred pounds.

U.S. Pat. No. 4,999,819 discloses a flextensional transducer now commonly known as a "moonie". The moonie includes an electroded piezoelectric plate bonded to and sandwiched between two metal plates each having a concave cavity. Moonie's provide better performance and larger displacements than conventional flextensional transducers. For example, under an applied field of 25V/mil, a two layer moonie with a total thickness of about 148 mils can exhibit a displacement of 1.5 mils (1.02% strain). However, as a result of its ability to sustain more strain than a conventional transducer, moonies can only sustain loads which are less than 100 pounds.

Other examples of indirect mode actuators include the unimorph, bimorph, multimorph and monomorph actuators. A typical unimorph is composed of a single piezoelectric element externally bonded to a flexible metal foil which is stimulated by the piezoelectric element when activated with a changing voltage and results in an axial buckling or deflection as it opposes the movement of the piezoelectric element. The actuator movement for a unimorph can be by contraction or expansion. Unimorphs can exhibit a strain of as high as 10% but can only sustain loads which are less than one pound.

A conventional bimorph device includes an intermediate flexible metal foil sandwiched between two piezoelectric elements bonded to the plate. Electrodes are bonded to each of the major surfaces of the ceramic elements and the metal foil is bonded to the inner two electrodes. A multilayer device known as a multimorph can be made by stacking alternating layers of ceramic elements and metal plates. When a voltage is applied to the electrodes, the bimorph or multimorph bends or vibrates. Bimorphs and multimorphs exhibit more displacement than unimorphs because under the applied voltage, one ceramic element will contract while the other expands. Bimorphs and multimorphs can exhibit strains up to 20% at 25 V/mil but as with unimorphs, cannot sustain loads greater than one pound.

A typical monomorph bender includes a piezoelectric plate with conductive electrodes disposed on each side thereof and is capable of bending similar to a bimorph. However, the bend in a monomorph is realized by a non-uniform electric field distribution in the piezoelectric plate. Monomorphs can exhibit strains up to 15% at 1 KV/mm but cannot sustain loads greater than approximately one pound.

U.S. Pat. No. 5,471,721 discloses a flextensional transducer now commonly known as a "rainbow". In the rainbow a first surface of a wafer becomes a metallic/conductive reduced form of the ceramic material. In addition, the wafer is concave shaped due to (1) volume shrinkage of the reduced material with respect to the unreduced material and (2) the difference in thermal expansion between the reduced side and the dielectric (unreduced) side. As a result of the concave shape, the reduced side is in tension while the dielectric side is in compression at zero applied field. The net effect is to place the electrically active side (dielectric side) of the rainbow wafer in compression which is the most desirable configuration for relatively reliability, load bearing capability and long life. The asymmetrical internal stress bias of the moonie's ceramic wafer also increases mechanical strength and creates out-of-plane displacement. U.S. Pat. No. 5,471,721 discloses 1-dimensionally symmetric rainbows, as well as dome-shaped transducers produced by using circular wafers.

Recently NASA has developed a Thin Layer Composite Unimorph Ferroelectric Driver and Sensor ("THUNDER"). THUNDER is a composite structure constructed with a PZT piezoelectric ceramic layer which is electroplated on its two major faces. A metal pres-stress layer is adhered to the electroplated surface on at least one side of the ceramic layer by an adhesive layer, which NASA calls "LaRC-SI™". During manufacture of the THUNDER actuator the ceramic layer, the adhesive layer and the first prestress layer are simultaneously heated to a temperature above the melting point of the adhesive, and then subsequently allowed to cool, thereby re-solidifying and setting the adhesive layer. During the cooling process the ceramic layer becomes strained, due to the higher coefficients of thermal contraction of the metal pre-stress layer and the adhesive layer than of the ceramic layer. Also, due to the greater thermal contraction of the laminate materials than the ceramic layer the ceramic layer deforms in an arcuate shape having a normally concave face. The THUNDER device reportedly generates significantly greater output deformation for a given voltage input than do prior ferroelectric and ferrostrictive devices.

A problem with virtually all prior electroactive devices is that the amount of strain (output) is substantially proportional to the voltage applied (input) to the electrodes.

Also, in ferroelectric and ferrostrictive devices the response time, (that is, the time lapse between electrical input and the occurrence of straining of the active element), is substantially instantaneous. So, the speed at which the device may become strained depends upon the speed at which the input voltage to the device is changed.

Also, prior ferroelectric and ferrostrictive devices typically have a single neutral configuration/position to which the device returns whenever electrical power (input) to the active element is turned off.

U.S. Pat. No. 4,383,195 to Kolm et al discloses a piezoelectric snap actuator in which a ceramic member is disposed on a major face of a spring member. The ceramic member has two electrodes, both disposed on the same face of the ceramic member. The device provides a "snap action", however, because the electrodes are both on the same face of the ceramic member, when a voltage potential is applied across the electrodes the strain is not uniform throughout the ceramic members, and force concentrations are generated. Furthermore, a relatively high amount of voltage is necessary to energize the device due to the gap between the two electrodes on the same exposed face.

The present invention overcomes the disadvantages of the prior art by disposing the electrodes on opposite faces of an electroactive element, so that less voltage is required to energize the device, and the force concentrations are minimized.

A further problem with the patent to Kolm et al is that it is not possible to prestress the ceramic member because the metal prestress layer would create an electrical short from one electrode to the other which are on the same side of the ceramic member. In the present invention, by disposing the electrodes on opposite sides of the electroactive element prestressing is possible because an electrical short will not be created. Also, it is possible to use the prestress layer or layers as an electrode to which a contact may be directly attached to.

SUMMARY OF THE INVENTION

Accordingly, it is a primary object of the present invention to provide a flextensional ferroelectric and/or ferrostrictive transducer in which the amount of strain (output) from the device does not vary linearly with the voltage applied (input) to the electrodes within operating range of strain of the device.

It is another object of the present invention to provide a flextensional ferroelectric and/or ferrostrictive transducer of the character described wherein the rate at which the device becomes strained does not vary linearly with the rate at which the input voltage to the device is changed.

It is another object of the present invention to provide a device of the character described which has two distinctive neutral (e.g. stable) configuration/positions to which the device may alternatively return whenever electrical power (input) to the active element is turned off.

It is another object of the present invention to provide a device of the character described comprising a ceramic element which adheres to a metal layer, wherein the metal layer applies a compressive stress to the ceramic element at all positions within the range between the two distinctive neutral configurations/positions, inclusive.

It is another object of the present invention to provide a device of the character described wherein there exists a toggle plane, disposed between the two distinctive neutral configurations/positions, such that whenever electrical power input to the active element is turned off, the device is biased to assume the closest neutral configuration/position.

It is another object of the present invention to provide a device of the character described wherein a minimal amount of voltage is necessary to energize the device.

It is another object of the present invention to provide a device of the character described wherein the electrodes are disposed on opposite sides of the ceramic element, thereby minimizing force concentrations when the device is energized, and allowing the ceramic element to be pre-stressed without creating an electrical short circuit.

Further objects and advantages of this invention will become apparent from a consideration of the drawings and ensuing description thereof.

BRIEF DESCRIPTION OF THE DRAWINGS

FIG. 1 is a medial cross-sectional view of the preferred embodiment of the invention shown in a first neutral position;

FIG. 2 is a medial cross-sectional view of the preferred embodiment of the invention shown with the active element aligned with a toggle plane;

FIG. 3 is a medial cross-sectional view of the preferred embodiment of the invention shown in a second neutral position;

DESCRIPTION OF THE PREFERRED EMBODIMENT

Figure 4:
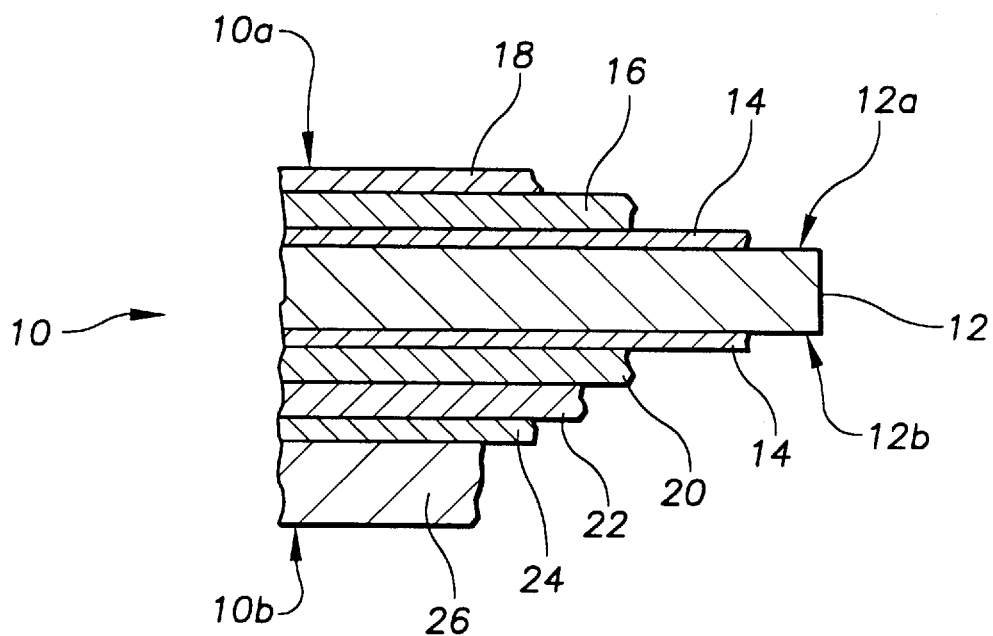
FIG. 4 is a partial cross-sectional view showing the details of construction of the various laminated layers of the present invention.

With initial reference to FIGS. 2 and 4, in the preferred method of manufacturing a snap-action transducer 10 an initially disc-shaped electroactive element 12 is electroplated 14 on its two major surfaces 12a and 12b. Adjacent one of the electroplated 14 surfaces of the electroactive element 12 is a first adhesive layer 16, (preferably LaRC-SI™ adhesive, as developed by NASA-Langley Research Center and commercially marketed by IMITEC, Inc. of Schenectady, N.Y.). Adjacent the first adhesive layer 16 is a circular-shaped first aluminum layer 18 which preferably forms the outside surface on one major face 10a of the transducer 10. A second adhesive layer 20 (also preferably LaRC-SI™ adhesive, as developed by NASA-Langley Research Center and commercially marketed by IMITEC, Inc. of Schenectady, N.Y.) is between a second aluminum layer 22 and the electroplated surface 14 on the second major surface 12b of the electroactive element 12. A third adhesive layer 24 is between the second aluminum layer 22 and a circular-shaped spring member 26.

In the preferred embodiment of the invention the electroactive element 12 is a piezoelectric material such as a PZT ceramic. By way of example, in the preferred embodiment of the invention the electroactive element 12 is between 1 and 2 inches in diameter and has a thickness of between 0.010 and 0.050 inches; the first aluminum layer 18 has a thickness of between 0.005 and 0.010 inches; the second aluminum layer has a thickness of between 0.005 and 0.010 inches; and the spring member has a thickness of between 0.010 and 0.050 inches. Electrical wires 28 are connected to the aluminum layers 18 and 22 on opposite sides of transducer 10 and to a electric power supply 30. The spring member 26 preferably is made of a metal of high elasticity, such as spring steel, which has a greater coefficient of thermal contraction than does the electroactive element 12.

During manufacture of the transducer 10 the electroactive element 12, the adhesive layers 16, 20 and 24, the two aluminum layers 18 and 22, and the spring member 26 are simultaneously heated to a temperature above the melting point of the adhesive material, and subsequently allowed to cool, thereby re-solidifying and setting the adhesive layers 16 and 20 and bonding them to the adjacent layers. During the cooling process the electroactive layer 12 becomes compressively stressed due to the relatively higher coefficients of thermal contraction of the materials of construction of the two aluminum layers 18 and 22 and the spring member 26 than for the material of the electroactive element 12. Also, due to the greater coefficient of thermal contraction of the combined laminate materials (e.g. second aluminum layer 22, the second and third adhesive layers 20 and 24, and the spring member 26) on one side of the electroactive element 12 than the laminate materials (e.g. the first adhesive layer 16 and the first aluminum layer 18) on the other side of the electroactive element 12, the laminated structure deforms into a normally dome shape such that the outer surface 10b of the transducer on one side of the transducer 10 is concave and the outer surface 10a on the other side of the transducer 10 is convex, as illustrated in FIG. 1.

In the preferred method of manufacturing the invention pressure is applied to the stacked laminate layers during the heating process (e.g. by a mechanical press, or by exposing the stacked laminate layers to an increased barometric/ambient pressure, etc.) in order to enhance the integrity of the adhesion of the various laminate layers to each other. However, it is within the scope of the present invention to construct a snap action transducer substantially as described without exposing the laminate layers to outside pressure during the heating step of the manufacturing process.

In the preferred embodiment of the invention the electroactive element 12 is poled in one direction. More specifically, in the preferred embodiment of the invention, the electroactive element 12 is poled in a thickness direction, such that when a voltage potential is applied across the electroplated surfaces 14 on its respective major faces 12a and 12b the electroactive element 12 longitudinally strains.

Figure 5:
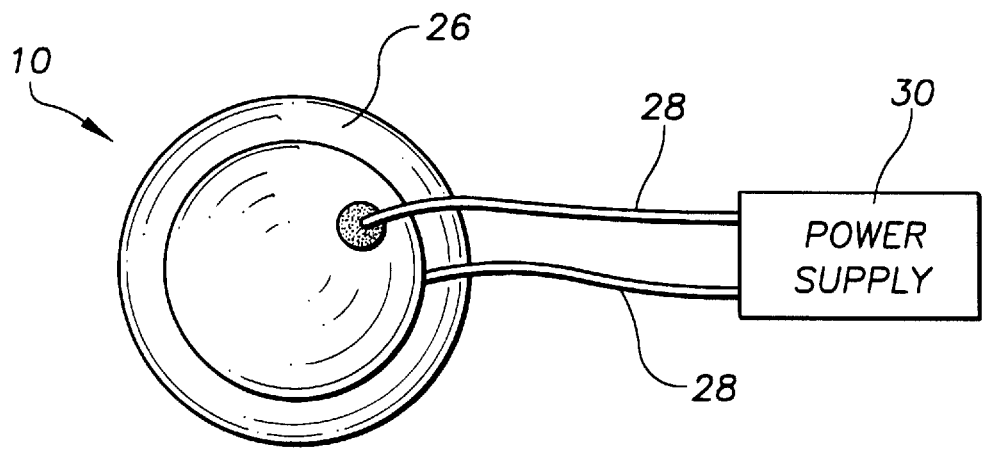
FIG. 5 is a plan view of the present invention.

Referring now to FIGS. 1 and 5: After the snap-action ferroelectric transducer 10 has been constructed in accordance with the foregoing process, the transducer 10 normally assumes a dome shape having an exposed concave surface 10b formed by the spring member 26. If no voltage is applied to the two electroplated surfaces 14 of the electroactive element 12 the transducer is biased to remain in this configuration/shape (i.e. having a convex face 10b on the exposed surface of the spring member 26) as illustrated in FIG. 1. This configuration/shape is referred to herein as the "first neutral position" of the transducer 10.

If a relatively small voltage is applied to the two electroplated surfaces 14 of the electroactive element 12, the electroactive element 12 will piezoelectrically expand or contract in a direction perpendicular to its opposing major faces 12a and 12b, depending on the polarity of the voltage being applied. Because of the relatively greater combined tensile strength of the laminate layers (i.e. the second aluminum layer 22, the second and third adhesive layers, and the spring member 26) bonded to one side of the electroactive element 12 than on the other (i.e. the first adhesive layer 16 and the first aluminum layer 18), piezoelectric longitudinal expansion of the electroactive element 12 causes the radius of the curvature R1 of the transducer 10 to become smaller. Conversely longitudinal contraction of the electroactive element 12 causes the transducer 10 to flatten out (i.e. the radius of curvature R1 of the transducer becomes larger). Thus it will be understood that the radius of curvature R1 of the transducer can be slightly increased or decreased (depending on the polarity of the applied voltage) by applying a small voltage to the transducer 10 from a power supply 30 via wires 28.

For a transducer 10 which is initially in the "first neutral position" (as illustrated in FIG. 1) the radius of curvature can be slightly increased (i.e. causing the device to flatten out) by applying a relatively small voltage (having a first polarity) to the electroplated surfaces 14 of the transducer. If the voltage is subsequently interrupted the transducer will once again assume (or, more accurately, be biased to assume) the "first neutral position". Similarly, for a transducer 10 which is initially in the "first neutral position" (as illustrated in FIG. 1) the radius of curvature can be slightly decreased by applying a relatively small voltage of opposite (a "second") polarity to the electroplated surfaces 14 of the transducer. If the voltage is subsequently interrupted the transducer will once again assume the "first neutral position". The "first neutral position" of the transducer 10 is characterized as being the position/configuration that the transducer 10 assumes under zero voltage input (absent the application of any external forces) whenever a plane (e.g. plane A) which intersects at least two diametrically opposed points on the perimeter 26a of the spring member 26 faces the concave face 10b of the spring member 26.

Referring now to FIG. 2: As discussed above the radius of curvature of a transducer 10 which is initially in the "first neutral position" (as illustrated in FIG. 1) can be increased (i.e. causing the device to flatten out) by applying a voltage (having a first polarity) to the electroplated surfaces 14 of the transducer. Within limits which will be discussed below, the amount of deformation (i.e. "flattening out") of the transducer generally varies proportionally with the magnitude of the voltage applied to the transducer. If sufficient voltage is applied to a transducer 10 which is initially in the first neutral position, the transducer can be made to flatten out, until it is in the position/configuration illustrated in FIG. 2.

The position/configuration of the transducer 10 illustrated in FIG. 2 is referred to herein as the "toggle position" of the transducer. The "toggle position" of the transducer 10 is characterized as a unique and inherently unstable position/configuration (FIG. 2) which the transducer 10 may assume, intermediately between a first neutral position (FIG. 1) and a second neutral position (FIG. 3), wherein the transducer is equally biased to assume either of said neutral positions upon cessation of voltage input to the transducer. In the case of a transducer 10, initially in the first neutral position, which becomes flattened out so as to assume the "toggle position" illustrated in FIG. 2 as a result of applied voltage, any additional voltage applied to the transducer will cause the device to pass through the toggle position and thereby become biased to assume a second neutral position (FIG. 3) upon cessation of voltage input to the transducer.

It will be understood that the "toggle position" is an inherently unstable position/configuration for the transducer 10. While in the "toggle position" the perimeter of the spring member 26a is subjected to high tensile (e.g. hoop) stresses which result from its being "flattened out" in the above-described manner. In particular, the tensile (e.g. hoop) stresses in the perimeter 26a of the spring member reach a maximum when the spring member 26 is in the "toggle position" (i.e. is substantially flat), as illustrated in FIG. 2.

Referring now to FIG. 3: Once the transducer has reached the "toggle position" (having initially been in the first neutral position), a relatively slight additional voltage input (having a first polarity) will cause additional elongation of the electroactive element 12 which, in turn, causes the exposed face 10b of the spring member 26 to become convex. As soon as the spring member 26 is deformed slightly beyond the "toggle position" to one in which the exposed face 10b of the spring member 26 becomes slightly convex, the entire transducer rapidly deforms, with the radius of curvature R2 of the exposed surface 10a of the transducer becoming smaller. It will be understood that by decreasing the radius of curvature R2 of the exposed surface 10a of the transducer, the length of the perimeter 26a of the spring member 26 is reduced, which reduces the tensile (e.g. hoop) stress in the spring member 26 at its perimeter 26a.

If the voltage is subsequently interrupted the transducer will assume the "second neutral position", as illustrated in FIG. 3. The "second neutral position" of the transducer 10 is characterized as being the position/configuration that the transducer 10 is biased to assume under zero voltage input whenever a plane C intersecting at least two diametrically opposed points on the perimeter 18a of the aluminum layer 18 faces the concave exposed face 10a of the first aluminum layer 18 of the transducer 10, as illustrated in FIG. 3.

Once the transducer is in the "second neutral position", the radius of curvature R2 of the device can be slightly increased (i.e. causing the device to flatten out) by applying a relatively small voltage (having a second, i.e. opposite, polarity) to the electroplated surfaces 14 of the transducer. If the voltage is subsequently interrupted the transducer will once again assume the "second neutral position". Similarly, for a transducer 10 which is initially in the "second neutral position" (as illustrated in FIG. 1) the radius of curvature can be slightly decreased by applying a relatively small voltage of the opposite (i.e. "first") polarity to the electroplated surfaces 14 of the transducer. If the voltage is subsequently interrupted the transducer will once again assume the "second neutral position". As discussed above the radius of curvature of a transducer 10 which is initially in the "second neutral position" (as illustrated in FIG. 3) can be increased (i.e. causing the device to flatten out) by applying a voltage to the electroplated surfaces 14 of the transducer. Within limits, the amount of deformation (i.e. "flattening out") of the transducer generally varies proportionally with the magnitude of the voltage applied to the transducer 10. If sufficient voltage (at a "second" polarity) is applied to a transducer 10 which is initially in the second neutral position, the transducer can be made to flatten out until it is in the "toggle position" of the transducer.

Again referring now to FIG. 1: Once the transducer has reached the "toggle position" (having initially been in the second neutral position), a relatively slight additional second polarity voltage input will cause additional elongation of the electroactive element 12 which, in turn, causes the exposed face 10b of the spring member 26 to become concave. As soon as the spring member 26 is deformed slightly beyond the "toggle position" to one in which the exposed face 10b of the spring member 26 becomes slightly concave, the entire transducer rapidly deforms, with the radius of curvature R1 of the exposed surface 10a of the spring member 26 of the transducer becoming smaller. It will be understood that by decreasing the radius of curvature R1 of the exposed surface 10a of the transducer, the length of the perimeter 26a of the spring member 26 is reduced, which reduces the tensile (hoop) stress in the spring member 26 at its perimeter 26a.

The preceding discussion describes the preferred embodiment of the present invention wherein the device has two inherent "neutral" positions/configurations (i.e. as illustrated in FIGS. 1 and 3) which the device is biased to assume whenever electrical power to the device is switched off, and an inherently unstable "toggle position" approximately midway between the two neutral positions (as illustrated in FIG. 2). Because in the preferred embodiment of the invention there are two such "neutral positions/configurations", the preferred embodiment of the invention is called a "bistable" device. In a bistable device constructed in accordance with the present invention, the particular neutral position which the device is biased to assume whenever power is turned off, is that neutral position which is closest to the configuration of the device at the time the power is cut off.

It will be appreciated by those skilled in the art that in order for the transducer to operate as a bistable device, the tensile (hoop) stress in the perimeter 26a of the spring member must be sufficiently high in any configuration of the transducer between the first and second neutral positions to overcome the combined compressive forces of the various laminate layers (12, 14, 16, 18, 20, 24, 26) of the transducer.

In a "monostable" modification of the present invention, there is but a single neutral configuration (e.g. as illustrated in FIG. 1) to which the device is biased to return whenever electric power to the device is cut off, regardless of the configuration/position of the transducer when the power is cut off. In order to construct a monostable modification of the present invention, it is necessary to select the described materials of construction, and dimensions of same, such that, when flattened from initially being in the first neutral position (per FIG. 1) to assume the position illustrated in FIG. 2, the tensile (hoop) stress in the perimeter 26a of the spring member is substantially equivalent to the combined compressive forces of the various laminate layers (12, 14, 16, 18, 20, 24, 26) when the transducer is in the position/configuration illustrated in FIG. 2; and the tensile (hoop) stress in the perimeter 26a of the spring member is greater than the combined compressive forces of the various laminate layers (12, 14, 16, 18, 20, 24, 26) when the transducer is in any position/configuration between those illustrated in FIG. 1 and FIG. 2. When the transducer is further deformed (i.e. by applying additional voltage to the device), the combined compressive forces of the various laminate layers (12, 14, 16, 18, 20, 24, 26) will continue to increase, but the tensile (hoop) stress in the perimeter 26a of the spring member will decrease (due to the reduction in the circumference of the perimeter as the position/configuration of the device deforms farther from that illustrated in FIG. 2). Because the compressive forces in the various laminate layers (12, 14, 16, 18, 20, 24, 26) continue to increase, but the tensile (hoop) stress in the perimeter 26a of the spring member decreases, as the device is deformed beyond the position/configuration illustrated in FIG. 2, whenever voltage input to the device is shut off from a monostable device constructed in accordance with the present invention, the device will be biased to assume the singular neutral position illustrated in FIG. 1.

In order to assure proper operation of the snap action transducer 10, it is necessary that the laminated structure be manufactured such that, in all positions/configurations between the first neutral position (FIG. 1) and the second neutral position (FIG. 3) the entire cross-sectional area of electroactive element 12 remains in net compression. It will be appreciated by an understanding of the foregoing disclosure that the electroactive element is subjected to a minimum net compressive stress when the transducer is in the first neutral position (as illustrated in FIG. 1).

It will be understood that in order to ensure proper operation of the snap-action transducer the material and dimensions of the spring member 26 must be such that when the spring member 26 may be deformed throughout the range from the first neutral position (FIG. 1) to the second neutral position (FIG. 3) without the spring member's 26 being strained beyond its elastic limit.

Although the first and second aluminum layers 18 and 22 provide some pre-stressing to the electroactive element 12, the principal function of those layers is to provide an electrically conductive material by which the electrical energy may be applied uniformly to the electroplated surfaces 14 of the electroactive element 12. In some instances the adhesive layers may comprise electrically insulating materials, in which cases it is advantageous to roughen the faces of the aluminum layers 18 and 22 which face the respective electroplated surfaces 14 so as to facilitate and maintain physical contact between the aluminum layers and the electroplated surfaces.

It will be understood from the foregoing disclosure that a snap action piezoelectric transducer constructed in accordance with the present invention provides a unique transducer in which the amount of strain (output) from the device does not vary linearly with the voltage applied (input) to the electrodes within operating range of strain of the device; and in which the rate at which the device becomes strained does not vary linearly with the rate at which the input voltage to the device is changed.

It will also be understood from the foregoing disclosure that a snap action piezoelectric transducer constructed in accordance with the present invention may either be of a bistable configuration or a monostable configuration, depending upon the materials of construction and dimensions of the various laminate layers of the device.

By way of example only, snap action transducers constructed in accordance with the present invention may be used in place of prior solenoid-type switches, actuators, and the like. The bistable configuration has the additional advantage (for example over prior solenoid-type switches and actuators) of being able to assume the nearest of either of two neutral positions/configuration whenever power to the device is cut off, and the device will continue to assume that position even without additional power input.

It will be understood from the foregoing description that the present invention comprises a snap action device (e.g. spring member 26) for exerting a positive force in opposition to an electroactive element 12 which has a predetermined reaction force that must be overcome to cause the snap action. The electroactive element 12 is mounted on the snap action device (e.g. spring member 26) and is capable of providing an opposing force to the spring member 26 in excess of the reaction force.

While the above description contains many specificities, these should not be construed as limitations on the scope of the invention, but rather as an exemplification of one preferred embodiment thereof. Many other variations are possible, for example:

The electric power supply 30 may be electrically connected to the with any common form of electric conductor, and need not comprise a wire 28 as described for the preferred embodiment of the invention;

The first aluminum layer 18 may be omitted, in which case electrical energy from the power supply 30 must be applied directly to an electroplated surface 14 of the electroactive element;

The adhesive layers 16, 20 and 24 may be made of other mechanically strong adhesives such as a polyimides, thermoplastics, thermosets and braze alloys;

The electroactive element 12 may be a piezostrictive material, piezoelectric material, or a composite;

The spring member may comprise any metal of high tensile strength and a high modulus of elasticity, including spring steel and other metals;

At the beginning of the manufacturing process (i.e. prior to simultaneously heating the laminate layers of the structure), the electroactive element 12 and/or the spring member 26 may be "pre-curved" rather than flat members;

The electrical conductors (i.e. wires 28) may be attached to the device by various common means including soldering, or brazing, and gluing, etc.;

The electrical conductors (i.e. wires 28) may either be attached to the aluminum layers (18, 22) or they may alternatively be attached directly to the electroplated surfaces 14 of the electroactive element 12;

The perimeters of the respective laminate layers (i.e. 12, 14, 16, 18, 20, 22, 24 and 26) may either be flush with each other or, alternatively, they may be staggered or uneven;

The "dome" shape of the device may be a spherical segment, a parabolic segment or other three-dimensional regular curved segment;

The various layers of which the transducer is comprised may be sizes and shapes other than those given with respect to the preferred embodiment of the invention;

One or more additional pre-stressing layer may be similarly adhered to either or both sides of the ceramic layer 67 in order, for example, to increase the stress in the ceramic layer 67 or to strengthen the actuator 12;

The snap-action transducer may be manufactured by placing initially dome-shaped laminate layers (12, 18, 22 and 26) in nesting relationship with each other, (for example as shown in FIG. 1 or FIG. 3), prior to the step of heating and subsequently cooling the materials, rather than starting with initially flat/disc-shape laminate layers as shown in FIG. 2.

I claim:

1. A piezoelectric actuator comprising:

a piezoelectric bender element having first and second opposing major faces;

a snap action device for exerting a reaction force in opposition to longitudinal deformation of said piezoelectric bender element and having a predetermined first reaction force magnitude that must be exceeded to cause the snap action, wherein said piezoelectric bender element is mounted on said snap-action devices;

and wherein said piezoelectric bender element comprises piezoelectric means for applying a longitudinal force to said snap-action device in excess of said first reaction force magnitude;

and wherein said piezoelectric means for applying a longitudinal force to said snap-action device comprises a piezoelectric ceramic layer;

and wherein said piezoelectric bender element further comprises means, including a pair of electrodes on opposing major faces of said piezoelectric ceramic layer, for applying an electric field to said piezoelectric ceramic layer to enable said piezoelectric bender element to generate said longitudinal force in excess of said first reaction force magnitude.

2. The apparatus according to claim 1, wherein said piezoelectric bender element has a thickness between said first and second opposing major faces, and a longitudinal direction oriented transverse to said thickness;

and wherein said piezoelectric bender element is poled in said thickness direction, such that when a voltage potential is applied between said pair of electrodes on each of said opposing major faces of said piezoelectric bender element, said piezoelectric bender element strains in said longitudinal direction.

3. The apparatus according to claim 2, wherein a first prestress layer is bonded to a major face of said piezoelectric bender element;

and wherein said first prestress layer normally applies a compressive force to said piezoelectric bender element in said longitudinal direction.

4. The apparatus according to claim 3, further comprising a second prestress layer bonded to a major face of said piezoelectric bender element;

and wherein said second prestress layer normally applies a compressive force to said piezoelectric bender element in said longitudinal direction;

and wherein said first prestress layer comprises an adhesive member.

5. The apparatus according to claim 3, wherein said first prestress layer comprises a first metallic member and wherein said first metallic member is bonded to a major face of said piezoelectric bender element.

6. The apparatus according to claim 4, wherein said second prestress layer comprises a second metallic member and wherein said second metallic member is bonded to a major face of said piezoelectric bender element.

* * * * *